United States Patent [19]
Cowles

[11] Patent Number: 5,946,265
[45] Date of Patent: *Aug. 31, 1999

[54] CONTINUOUS BURST EDO MEMORY DEVICE

[75] Inventor: Timothy B. Cowles, Boise, Id.

[73] Assignee: Micron Technology, Inc., Boise, Id.

[*] Notice: This patent is subject to a terminal disclaimer.

[21] Appl. No.: 08/891,557

[22] Filed: Jul. 11, 1997

Related U.S. Application Data

[63] Continuation of application No. 08/572,487, Dec. 14, 1995, Pat. No. 5,729,504.

[51] Int. Cl.$^6$ .............................. G11C 8/00; G11C 16/04
[52] U.S. Cl. .............. 365/233; 365/189.05; 365/230.08; 365/236; 365/238.5
[58] Field of Search ........................ 365/189.05, 230.08, 365/233, 236, 238.5

[56] References Cited

U.S. PATENT DOCUMENTS

| | | | |
|---|---|---|---|
| 4,334,156 | 6/1982 | Eaton et al. | 365/203 |
| 4,355,377 | 10/1982 | Sud et al. | 365/203 |

(List continued on next page.)

FOREIGN PATENT DOCUMENTS

| | | |
|---|---|---|
| 0468480 | 1/1992 | European Pat. Off. . |
| 0547890 | 6/1993 | European Pat. Off. . |
| 19507562 | 9/1995 | Germany . |

OTHER PUBLICATIONS

"DRAM 1 Meg×4 DRAM 5VEDO Page Mode", *1995 DRAM Data Book*,, pp. 1–1 thru 1–30,, (Micron Technology, I).
"Rossini, Pentium, PCI–ISA, Chip Set", *Symphony Laboratories*,, entire book.
"4MDRAM 1991", *Toshiba America Electronic Components, Inc.*, pp. A–137–A159.
"Application Specific DRAM", *Toshiba America Electronic Components, Inc.*, C178, C–260, C 218, (1994).
"Burst DRAM Function & Pinout", *Oki Electronic Ind., Co., Ltd.*, 2nd Presentation, Item # 619, (Sep. 1994).
"Hyper page mode DRAM", *8029 Electronic Engineering 66, No. 813,*, Woolwich, London GB, pp. 47–48, (Sep. 1994).
"Hyper Page Mode DRAM", *Electronic Engineering, vol. 66, No. 813*, pp. 47–48, (Sep. 1994).
"Hyper Page mode DRAM", *Electronic Engineering, 66, No. 813*, Woolwich, London, GB, pp. 47–48, (Sep. 1994).
"Hyper Page Mode DRAM", *Electronic Engineering 8029*, No. 813, Woolwich, London, GB, pp. 47–48, (Sep. 1994).
"Hyper Page Mode DRAM", *Electronic Engineering*, 66, No. 813, pp. 47–48, (Sep. 1994).
"Micron Semiconductor, Inc.", *1994 DRAM Data Book, entire book*.
Mosel–Vitelic V53C8257H DRAM Specification Shhet, 20 pages, Jul. 2, 1994.
"Pipeland Burst DRAM", *Toshiba, JEDEC JC 42.3 Hawaii*, (Dec. 1994).
"Samsung Synchronous DRAM", *Revision 1*, Samsung Electronics, 1–16, (Mar. 1993).

(List continued on next page.)

*Primary Examiner*—Trong Phan
*Attorney, Agent, or Firm*—Schwegman, Lundberg, Woessner & Kluth P.A.

[57] ABSTRACT

An integrated circuit memory device is described which can operate at high data speeds. The memory device can either store or retrieve data from the memory in a burst access operation. The burst operations latch a memory address from external address lines and internally generates additional memory addresses. The integrated circuit memory can output data in a continuous stream while new rows of the memory are accessed. A method and circuit are described for outputting a burst of data stored in a first row of the memory while accessing a second row of the memory.

15 Claims, 7 Drawing Sheets

U.S. PATENT DOCUMENTS

| | | | |
|---|---|---|---|
| 4,484,308 | 11/1984 | Lewandowski et al. | 364/900 |
| 4,510,603 | 4/1985 | Catiller | 714/742 |
| 4,513,389 | 4/1985 | Devchondhury | 364/900 |
| 4,562,555 | 12/1985 | Ouchi et al. | 365/233 |
| 4,567,579 | 1/1986 | Patel et al. | 365/189.05 |
| 4,575,825 | 3/1986 | Ozaki et al. | 365/189.08 |
| 4,603,403 | 7/1986 | Toda | 365/189.05 |
| 4,618,947 | 10/1986 | Tran et al. | 365/230.08 |
| 4,636,986 | 1/1987 | Pinkham | 365/195 |
| 4,649,522 | 3/1987 | Kirsh | 365/189.05 |
| 4,685,089 | 8/1987 | Patel et al. | 365/233 |
| 4,707,811 | 11/1987 | Takamae et al. | 365/239 |
| 4,750,839 | 6/1988 | Wang et al. | 365/233 |
| 4,788,667 | 11/1988 | Nakano | 365/193 |
| 4,799,199 | 1/1989 | Scales et al. | 365/230.08 |
| 4,847,758 | 7/1989 | Olson et al. | 364/200 |
| 4,870,622 | 9/1989 | Aria et al. | 365/230.03 |
| 4,875,192 | 10/1989 | Matsumoto | 365/193 |
| 4,926,314 | 5/1990 | Dhuey | 364/200 |
| 4,933,910 | 6/1990 | Olson et al. | 365/238.5 |
| 4,984,217 | 1/1991 | Sato | 365/230.09 |
| 4,993,027 | 2/1991 | McGraw et al. | 371/16.2 |
| 5,058,066 | 10/1991 | Yu | 365/189.05 |
| 5,083,296 | 1/1992 | Hara et al. | 365/230.08 |
| 5,126,975 | 6/1992 | Handy et al. | 365/230.08 |
| 5,210,723 | 5/1993 | Bates et al. | 365/238.5 |
| 5,237,689 | 8/1993 | Behnke | 395/700 |
| 5,253,357 | 10/1993 | Allen et al. | 395/425 |
| 5,267,200 | 11/1993 | Tobita | 365/189.05 |
| 5,268,865 | 12/1993 | Takasugi | 365/189.05 |
| 5,280,594 | 1/1994 | Young et al. | |
| 5,301,278 | 4/1994 | Bowater et al. | 395/275 |
| 5,305,284 | 4/1994 | Iwase | 365/238.5 |
| 5,307,320 | 4/1994 | Farrer et al. | 365/230.01 |
| 5,319,759 | 6/1994 | Chan | 395/400 |
| 5,323,352 | 6/1994 | Miyata et al. | 365/222 |
| 5,325,330 | 6/1994 | Morgan | 365/189.05 |
| 5,325,502 | 6/1994 | McLaury | 395/425 |
| 5,333,305 | 7/1994 | Neufeld | 395/575 |
| 5,335,336 | 8/1994 | Kametani | 395/425 |
| 5,339,276 | 8/1994 | Takasugi | 365/230.08 |
| 5,349,566 | 9/1994 | Merritt et al. | 365/233.5 |
| 5,357,469 | 10/1994 | Sommer et al. | 365/193 |
| 5,363,330 | 11/1994 | Kobayashi et al. | 365/185 |
| 5,373,227 | 12/1994 | Keeth | 323/313 |
| 5,379,261 | 1/1995 | Jones, Jr. | 365/230.08 |
| 5,386,385 | 1/1995 | Stephens, Jr. | 365/189.05 |
| 5,392,239 | 2/1995 | Margulis et al. | 365/189.05 |
| 5,394,535 | 2/1995 | Ohuchi | 395/425 |
| 5,400,292 | 3/1995 | Fukiage et al. | 365/230.01 |
| 5,410,670 | 4/1995 | Hansen et al. | 395/425 |
| 5,436,969 | 7/1995 | Yoshida | 365/230.08 |
| 5,449,941 | 9/1995 | Yamazaki et al. | 257/411 |
| 5,452,261 | 9/1995 | Chung et al. | 365/233 |
| 5,454,107 | 9/1995 | Lehman et al. | 395/480 |
| 5,457,659 | 10/1995 | Schaefer | 365/222 |
| 5,483,498 | 1/1996 | Hotta | 365/233.5 |
| 5,485,428 | 1/1996 | Lin | 365/221 |
| 5,487,049 | 1/1996 | Hang | 365/221 |
| 5,513,148 | 4/1996 | Zager | 365/233 |
| 5,522,064 | 5/1996 | Aldereguia et al. | 395/550 |
| 5,526,320 | 6/1996 | Zagar et al. | 365/230.08 |
| 5,561,814 | 10/1996 | Glew et al. | 395/833 |
| 5,568,445 | 10/1996 | Park et al. | 365/233 |
| 5,598,376 | 1/1997 | Merritt et al. | 365/230.06 |
| 5,610,864 | 3/1997 | Manning | 365/193 |
| 5,640,364 | 6/1997 | Merrit et al. | 365/233.5 |
| 5,640,507 | 6/1997 | Lipe | 395/183.01 |
| 5,651,130 | 7/1997 | Hinkle et al. | 395/432 |
| 5,652,724 | 7/1997 | Manning | 365/189.05 |
| 5,661,695 | 8/1997 | Zagar et al. | 365/233.5 |
| 5,668,773 | 9/1997 | Zagar et al. | 365/233 |
| 5,675,549 | 10/1997 | Ong et al. | 365/233.5 |
| 5,706,247 | 1/1998 | Merritt et al. | 365/233.5 |
| 5,721,859 | 2/1998 | Manning | 397/421.07 |
| 5,729,504 | 3/1998 | Cowles | 365/236 |
| 5,729,709 | 3/1998 | Harness | 395/405 |

OTHER PUBLICATIONS

"Samsung Synchronous DRAM", *Samsung Electronics*, pp. 1–16, (Mar. 1993).

"Synchronous DRAM 2 MEG cx 8 SDRAM", *Micron Semiconductor, Inc.*, pp. 2–43 through 2–8.

Bursky, D., "Novel I/O Options and Innovative Architectures Let DRAMs Achieve SRAM Performance; Fast DRAMS can be swapped for SRAM Caches", *Electronics Design*, vol. 41, No. 15, Cleveland, Ohio, pp. 55–67, (Jul. 22, 1993).

Gowni, S.P., et al., "A 9NS, 32K×9, BICMOS TTL Synchronous Cache RAM With Burst Mode Access", *IEEE*, Custom Integrated Circuits Conference, pp. 781–786, (Mar. 3, 1992).

Gowni, et al., "Synchronous Cache RAM with Burst ;Mode Access", *IEEE 1992 Custom Intgrated Circuits Conference*, Boston USA, pp. 781–784, (May 1992).

Oki, "Burst DRAM Function and Pinout, 128KX16/256KX16", *Oki Electric Ind. Co., Ltd.*, 2nd presentation, *Item #619*, 1–4, (1994).

| Burst Length | Starting Column Address | | | Linear | Interleave |
|---|---|---|---|---|---|
| | $A_2$ | $A_1$ | $A_0$ | | |
| 2 | V | V | 0 | 0-1 | 0-1 |
| | V | V | 1 | 1-0 | 1-0 |
| 4 | V | 0 | 0 | 0-1-2-3 | 0-1-2-3 |
| | V | 0 | 1 | 1-2-3-0 | 1-0-3-2 |
| | V | 1 | 0 | 2-3-0-1 | 2-3-0-1 |
| | V | 1 | 1 | 3-0-1-2 | 3-2-1-0 |
| 8 | 0 | 0 | 0 | 0-1-2-3-4-5-6-7 | 0-1-2-3-4-5-6-7 |
| | 0 | 0 | 1 | 1-2-3-4-5-6-7-0 | 1-0-3-2-5-4-7-6 |
| | 0 | 1 | 0 | 2-3-4-5-6-7-0-1 | 2-3-0-1-6-7-4-5 |
| | 0 | 1 | 1 | 3-4-5-6-7-0-1-2 | 3-2-1-0-7-6-5-4 |
| | 1 | 0 | 0 | 4-5-6-7-0-1-2-3 | 4-5-6-7-0-1-2-3 |
| | 1 | 0 | 1 | 5-6-7-0-1-2-3-4 | 5-4-7-6-1-0-3-2 |
| | 1 | 1 | 0 | 6-7-0-1-2-3-4-5 | 6-7-4-5-2-3-0-1 |
| | 1 | 1 | 1 | 7-0-1-2-3-4-5-6 | 7-6-5-4-3-2-1-0 |

FIG. 2
(PRIOR ART)

CONTINUOUS BURST EDO MEMORY DEVICE

This application is a continuation of U.S. patent application Ser. No. 08/572,487, filed Dec. 14, 1995 now U.S. Pat. No. 5,729,504.

TECHNICAL FIELD OF THE INVENTION

The present invention relates generally to integrated circuit memories and in particular the present invention relates to burst access memories.

BACKGROUND OF THE INVENTION

A wide variety of integrated circuit memories are available for storing data. One type of memory is the dynamic random access memory (DRAM). A DRAM is designed to store data in memory cells formed as capacitors. The data is stored in a binary format; a logical "one" is stored as a charge on a capacitor, and a logical "zero" is stored as a discharged capacitor. The typical DRAM is arranged in a plurality of addressable rows and columns. To access a memory cell, a row is first addressed so that all memory cells coupled with that row are available for accessing. After a row has been addressed, at least one column can be addressed to pinpoint at least one specific memory cell for either reading data from, or writing data to via external data communication lines. The data stored in the memory cells is, therefore, accessible via the columns.

With the constant development of faster computer and communication applications, the data rates in which a memory circuit must operate continue to increase. To address the need for increased data rates, a variety of DRAMs are commercially available. These memories are produced in a variety of designs which provide different methods of reading from and writing to the dynamic memory cells of the memory. One such method is page mode operation. Page mode operations in a DRAM are defined by the method of accessing a row of a memory cell array and randomly accessing different columns of the array. Data stored at the row and column intersection can be read and output while that column is accessed. Page mode DRAMs require access steps which limit the communication speed of the memory circuit.

An alternate type of memory circuit is the extended data output (EDO) memory which allows data stored at a memory array address to be available as output after the addressed column has been closed. This memory circuit can increase some communication speeds by allowing shorter access signals without reducing the time in which memory output data is available on the communication lines. Column access times are, therefore, "masked" by providing the extended data output. A more detailed description of a DRAM having EDO features is provided in the "1995 DRAM Data Book" pages 1-1 to 1-30 available from Micron Technology, Inc. Boise, Id., which is incorporated herein by reference.

Yet another type of memory circuit is a burst access memory which receives one address of a memory array on external address lines and automatically addresses a sequence of columns without the need for additional column addresses to be provided on the external address lines. By reducing the external address input signals, burst EDO memory circuits (BEDO) are capable of outputting data at significantly faster communication rates than the above described memory circuits.

Although BEDO memories can operate at significantly faster data rates than non-burst memories, bursts of output data are terminated when changing from one memory row to another. The alternative to terminating a data burst is to wait until a data burst is complete until the memory row is changed. Changing memory rows is time consuming and because data is interrupted during the transition between rows, the data rate of the memory circuits is slowed.

For the reasons stated above, and for other reasons stated below which will become apparent to those skilled in the art upon reading and understanding the present specification, there is a need in the art for a burst access memory which allows a data burst to continue while receiving and addressing a new memory row address.

SUMMARY OF THE INVENTION

The above mentioned problems with integrated memory circuits and other problems are addressed by the present invention and which will be understood by reading and studying the following specification. A memory device is described which allows a new memory array row to be accessed while continually outputting data from a prior memory row.

In particular, the present invention describes a synchronous memory device comprising an input for receiving a clock signal, a plurality of addressable memory elements, a plurality of external address inputs, address counter circuitry for receiving a first address on the plurality of external address inputs, and for generating a sequence of addresses in response to the first address and the clock signal, and output buffer circuitry adapted to drive a sequence of data from the memory device. The output buffer circuitry is adapted to continue to drive the sequence of data from the memory device while a new address is received by the address counter circuitry.

In another embodiment, a method is described of reading data from a synchronous memory device having a plurality of addressable memory elements arranged in rows and columns. The method comprises the steps of receiving a first row address, receiving a first column address, accessing a row of memory elements having the first row address, generating a sequence of column addresses starting at the first column address, outputting data stored at the sequence of column addresses, receiving a second row address while outputting the data stored at the sequence of column addresses, and accessing a row of memory elements having the second row address while outputting the data stored at the sequence of column addresses.

In another embodiment, a memory device is described which comprises a plurality of addressable memory elements, a plurality of external address inputs, first means for receiving a first address on the plurality of external address inputs, and for generating a sequence of addresses in response to the first address, and second means for driving a sequence of data from the memory device while a new address is received by the first means.

BRIEF DESCRIPTION OF THE DRAWINGS

FIG. 2 illustrates linear and interleaved addressing sequences;

FIG. 6b is a continuation of the timing diagram of FIG. 6a;

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

BEDO Memories

Figure 1:
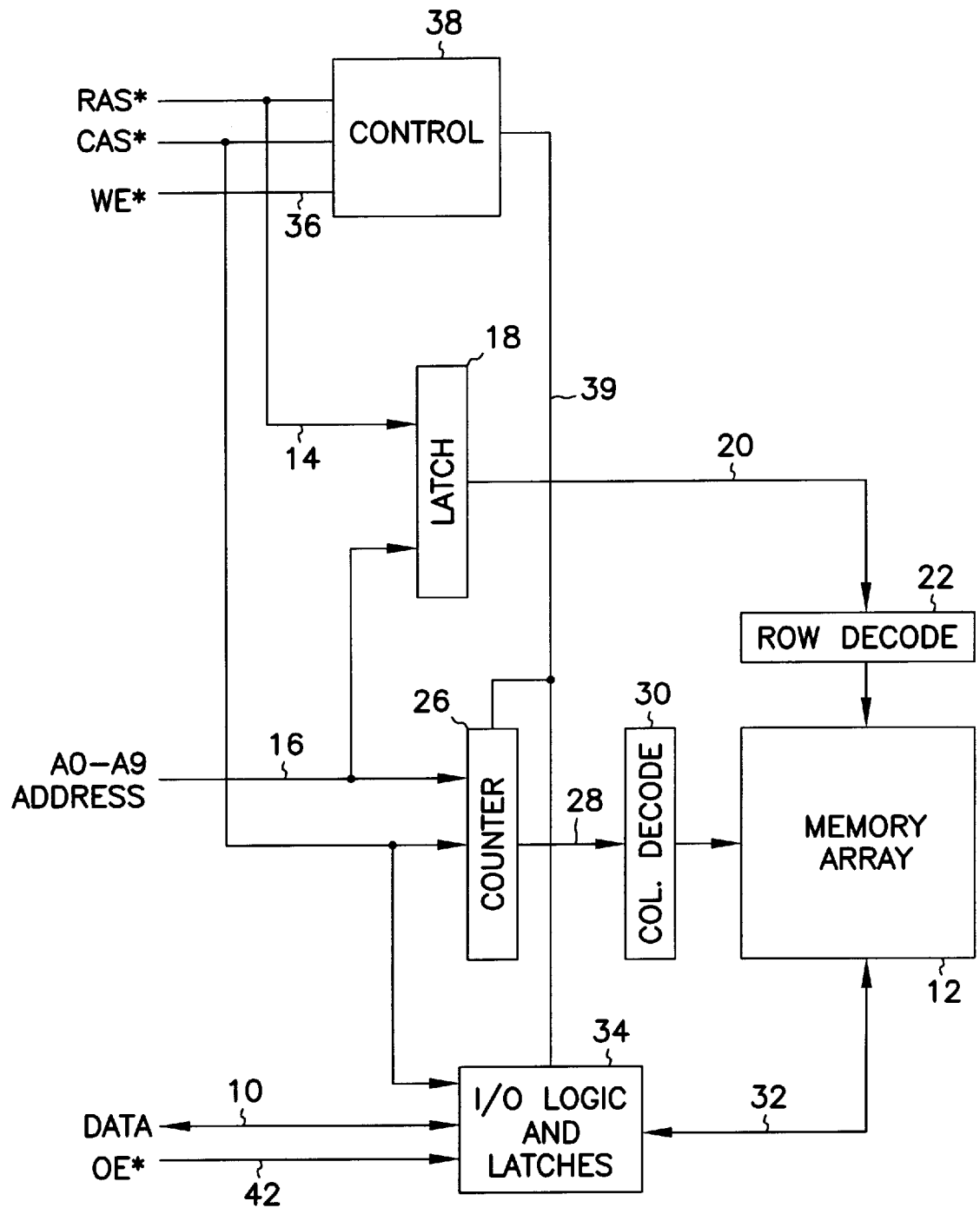
FIG. 1 is a block diagram of a memory device incorporating burst access.

To fully understand the present invention, a detailed description is provided of a burst extended data output memory circuit (BEDO). FIG. 1 is a schematic representation of a sixteen megabit device designed to operate in a burst access mode. The device is organized as a 2 Meg×8 burst EDO DRAM having an eight bit data input/output path 10 providing data storage for 2,097,152 bytes of information in the memory array 12. An active-low row address strobe (RAS*) signal 14 is used to latch a first portion of a multiplexed memory address, from address inputs AO through A10 16, in latch 18. The latched row address 20 is decoded in row decoder 22. The decoded row address is used to select a row of the memory array 12. An active-low column address strobe (CAS*) signal 24 is used to latch a second portion of a memory address from address inputs 16 into column address counter 26. The latched column address 28 is decoded in column address decoder 30. The decoded column address is used to select a column of the memory array 12.

In a burst read cycle, data within the memory array located at the row and column address selected by the row and column address decoders is read out of the memory array and sent along data path 32 to output latches 34. Data 10 driven from the burst EDO DRAM may be latched external to the device with a CAS* signal after a predetermined number of CAS* cycle delays (latency). For a two cycle latency design, the first CAS* falling edge during a RAS* cycle is used to latch the initial address for the burst access. The first burst data from the memory is driven from the memory after the second CAS* falling edge, and remains valid through the third CAS* falling edge. Once the memory device begins to output data in a burst read cycle, the output drivers 34 will continue to drive the data lines without tri-stating the data outputs during CAS* high intervals dependent on the state of the output enable 42 and write enable 36 (OE* and WE*) control lines, thus allowing additional time for the system to latch the output data. Once a row and a column address are selected, additional transitions of the CAS* signal are used to advance the column address within the column address counter in a predetermined sequence. The time at which data will be valid at the outputs of the burst EDO DRAM is dependent only on the timing of the CAS* signal provided that OE* is maintained low, and WE* remains high. The output data signal levels may be driven in accordance with standard CMOS, TTL, LVTTL, GTL, or HSTL output level specifications.

The address may be advanced linearly, or in an interleaved fashion for maximum compatibility with the overall system requirements. FIG. 2 is a table which shows linear and interleaved addressing sequences for burst lengths of 2, 4 and 8 cycles. The "V" for starting addresses A1 and A2 in the table represent address values that remain unaltered through the burst sequence. The column address may be advanced with each CAS* transition. When the address is advanced with each transition of the CAS* signal, data is also driven from the part after each transition following the device latency which is then referenced to each edge of the CAS* signal. This allows for a burst access cycle where CAS* toggles only once (high to low or low to high) for each memory cycle. This is in contrast to standard DRAMs which require CAS* to go low and then high for each cycle, and synchronous DRAMs which require a full CAS* cycle (high and low transitions) for each memory cycle.

In the burst access memory device, each new column address from the column address counter is decoded and is used to access additional data within the memory array without the requirement of additional column addresses being specified on the address inputs 16. This burst sequence of data will continue for each CAS* falling edge until a predetermined number of data accesses equal to the burst length has occurred. A CAS* falling edge received after the last burst address has been generated will latch another column address from the address inputs 16 and a new burst sequence will begin. Read data is latched and output with each falling edge of CAS* after the first CAS* latency. For a burst write cycle, data 10 is latched in input data latches 34. Data targeted at the first address specified by the row and column addresses is latched with the CAS* signal when the first column address is latched (write cycle data latency is zero). Other write cycle data latency values are possible; however, for today's memory systems, zero is preferred. Additional input data words for storage at incremented column address locations are latched by CAS* on successive CAS* pulses. Input data from the input latches 34 is passed along data path 32 to the memory array where it is stored at the location selected by the row and column address decoders. As in the burst read cycle previously described, a predetermined number of burst access writes will occur without the requirement of additional column addresses being provided on the address lines 16. After the predetermined number of burst writes has occurred, a subsequent CAS* will latch a new beginning column address, and another burst read or write access will begin.

Control circuitry 38, in addition to performing standard DRAM control functions, controls the I/O circuitry 34 and the column address counter/latch 26. The control circuity determines when a current data burst should be terminated based upon the state of RAS* 14, CAS* 24 and WE* 36. The write enable signal is used in burst access cycles to select read or write burst accesses when the initial column address for a burst cycle is latched by CAS*. WE* low at the column address latch time selects a burst write access. WE* high at the column address latch time selects a burst read access. The level of the WE* signal must remain high for read and low for write burst accesses throughout the burst access. A low to high transition within a burst write access will terminate the burst access, preventing further writes from occurring. A high to low transition on WE* within a burst read access will likewise terminate the burst read access and will place the data output 10 in a high impedance state. Transitions of the WE* signal may be locked out during critical timing periods within an access cycle in order to reduce the possibility of triggering a false write cycle. After the critical timing period, the state of WE* will determine whether a burst access continues, is initiated, or is terminated. Termination of a burst access resets the burst length counter and places the DRAM in a state to receive another burst access command. In the case of burst reads, WE* will transition from high to low to terminate a first burst read, and then WE* will transition back high prior to the next falling edge of CAS* in order to specify a new burst read cycle. For burst writes, WE* would transition high to terminate a current burst write access, then back low prior to the next falling edge of CAS* to initiate another burst write access. Both RAS* and CAS* going high during a burst access will also terminate the burst access cycle placing the data drivers in a high impedance output state, and resetting the burst length counter.

A basic implementation of the device of FIG. 1 may include a fixed burst length of 4, a fixed CAS* latency of 2 and a fixed interleaved sequence of burst addresses. Further, just as fast page mode DRAMs and EDO DRAMs are available in numerous configurations including x1, x4, x8 and x16 data widths, and 1 Megabit, 4 Megabit, 16 Megabit and 64 Megabit densities; the burst access memory device of FIG. 1 may take the form of many different memory organizations.

Figure 3:
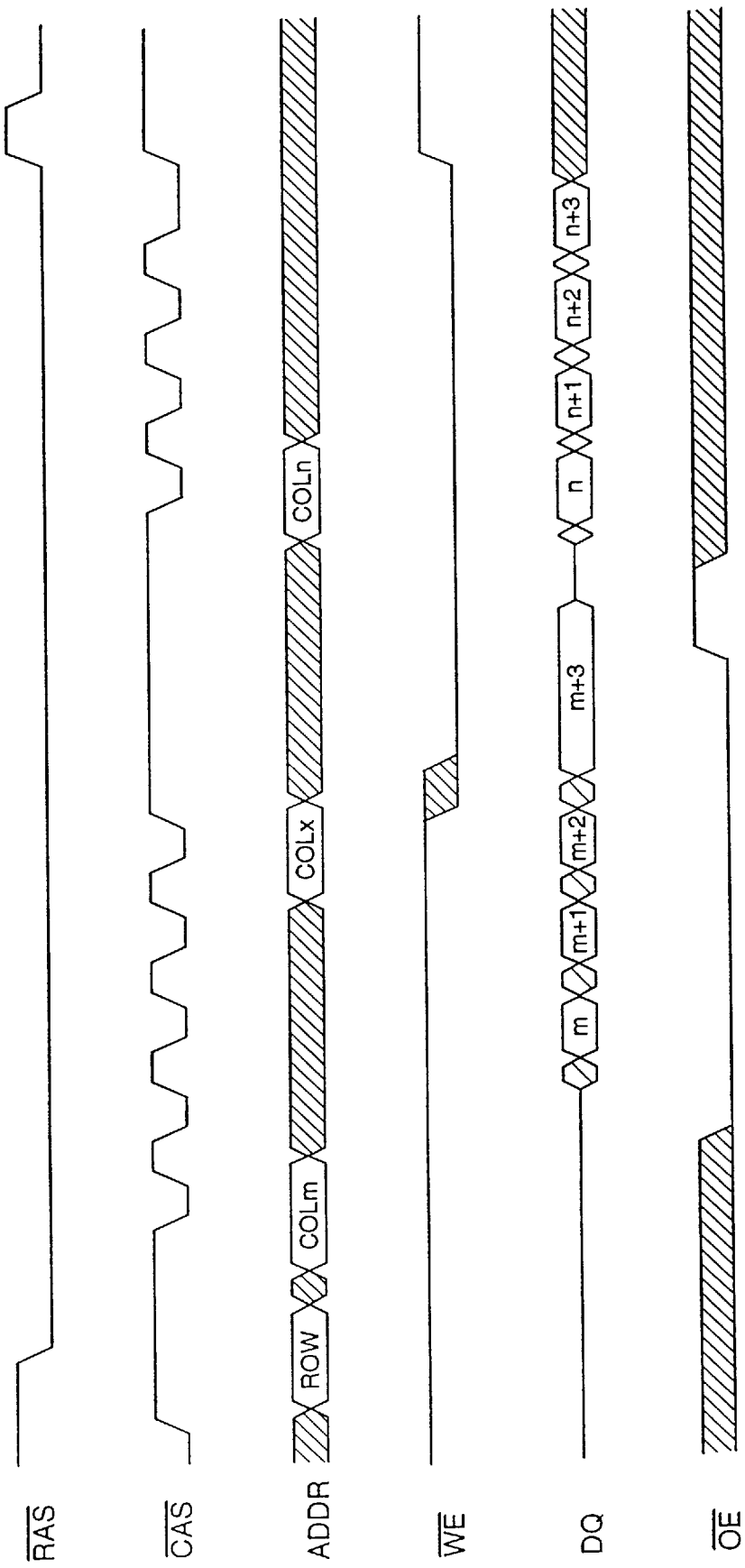
FIG. 3 is a timing diagram of a burst read followed by a burst write of the device of FIG. 1.

FIG. 3 is a timing diagram for performing a burst read followed by a burst write of the device of FIG. 1. In FIG. 3, a row address is latched by the RAS* signal. WE* is low when RAS* falls for an embodiment of the design where the state of the WE* pin is used to specify a burst access cycle at RAS* time. Next, CAS* is driven low with WE* high to initiate a burst read access, and the column address is latched. The data out signals (DQ's) are not driven in the first CAS* cycle. On the second falling edge of the CAS* signal, the internal address generation circuitry advances the column address and begins another access of the array, and the first data out is driven from the device after a CAS* to data access time ($T_{CAC}$). Additional burst access cycles continue, for a device with a specified burst length of four, until the fifth falling edge of CAS* which latches a new column address for a new burst read access. WE* falling in the fifth CAS* cycle terminates the burst access, and initializes the device for additional burst accesses. The sixth falling edge of CAS* with WE* low is used to latch a new burst address, latch input data and begin a burst write access of the device. Additional data values are latched on successive CAS* falling edges until RAS* rises to terminate the burst access.

Figure 4:
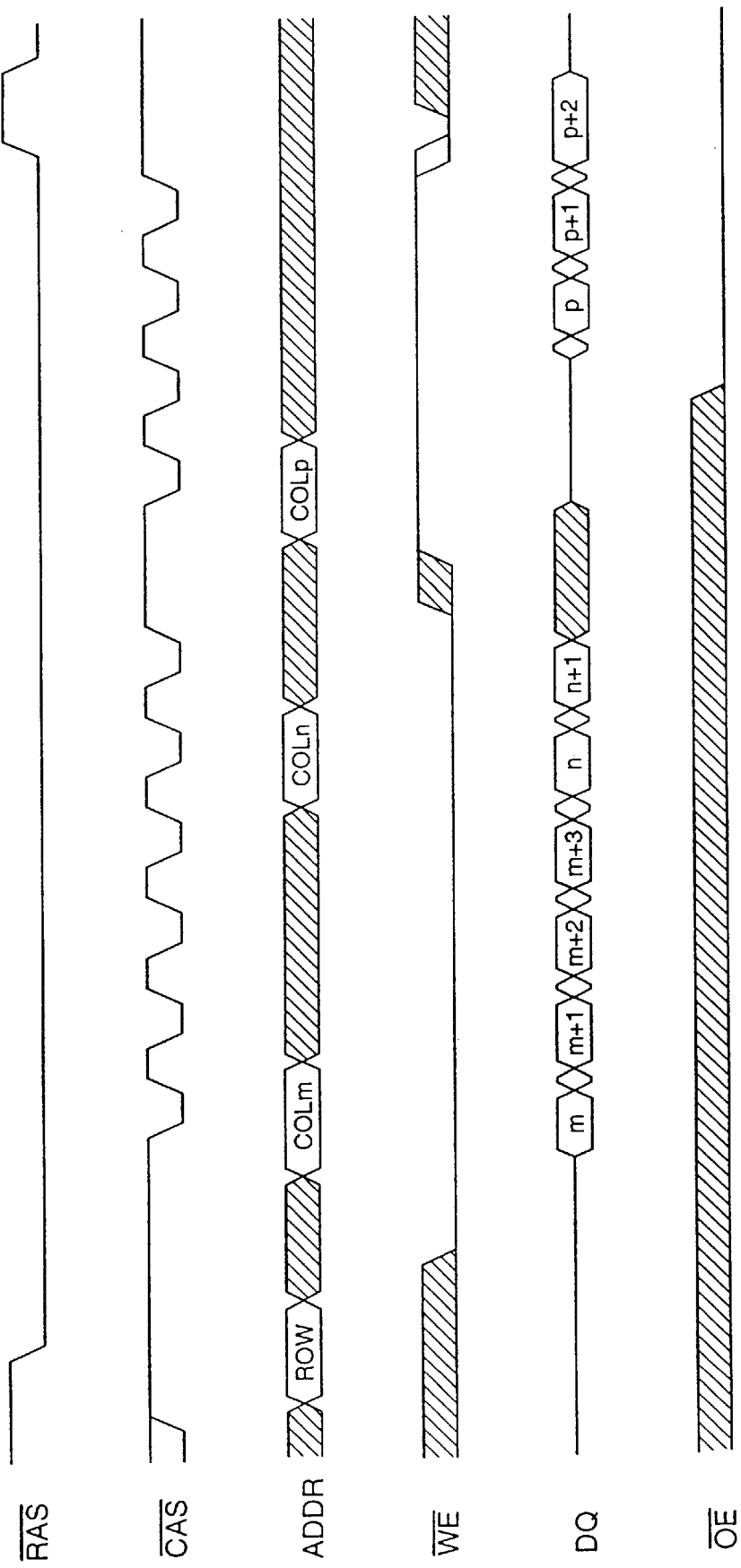
FIG. 4 is a timing diagram of a burst write followed by a burst read of the device of FIG. 1.

FIG. 4 is a timing diagram depicting burst write access cycles followed by burst read cycles. As in FIG. 3, the RAS* signal is used to latch the row address. The first CAS* falling edge in combination with WE* low begins a burst write access with the first data being latched. Additional data values are latched with successive CAS* falling edges, and the memory address is advanced internal to the device in either an interleaved or sequential manner. On the fifth CAS* falling edge a new column address and associated write data are latched. The burst write access cycles continue until the WE* signal goes high in the sixth- CAS* cycle. The transition of the WE* signal terminates the burst write access. The seventh CAS* low transition latches a new column address and begins a burst read access (WE* is high). The burst read continues until RAS* rises terminating the burst cycles.

Continuous BEDO (CBEDO)

Figure 5:
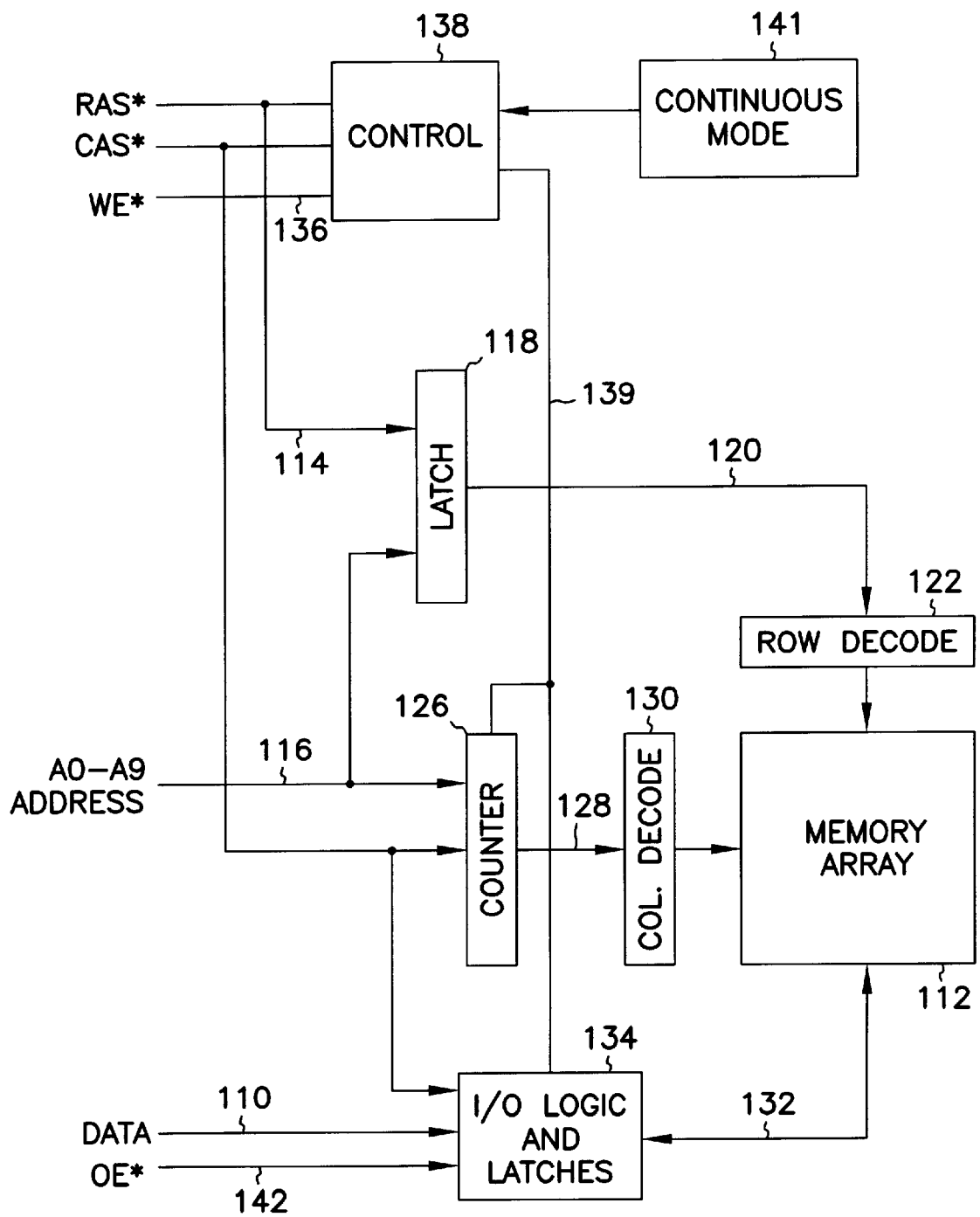
FIG. 5 is a block diagram of a memory device incorporating the features of the present invention.

FIG. 5 illustrates a continuous memory circuit which includes all of the features of the standard BEDO memory as described above. The continuous memory circuit, however, operates differently than the previously described BEDO memory when the row access signal (RAS*) is inactive. That is, as explained above, a burst access operation is terminated when the RAS* and the CAS* signals go high in a standard BEDO circuit. Time specifications for the BEDO circuitry dictates that the RAS* signal remain high for a minimum time of $T_{RP}$ (precharge time). Further, a minimum access time $T_{RAC}$, measured from the falling edge of RAS*, is required to access the new row. As a result, a new memory row cannot be accessed until a minimum time of $T_{RAC}+T_{RP}$ has passed following the rising edge of RAS*. Typical times for $T_{RAC}$ and $T_{RP}$ are 60 ns and 40 ns, respectively. To eliminate this 100 ns time period in which data is not being provided as output, circuitry is provided in control 139 of the memory circuit.

FIG. 5 is a schematic representation of a sixteen megabit device designed to operate in a burst access mode and incorporating the features of present invention. The device is organized as a 2 Meg×8 burst EDO DRAM having an eight bit data input/output path 110 providing data storage for 2,097,152 bytes of information in the memory array 112. An active-low row address strobe (RAS*) signal 114 is used to latch a first portion of a multiplexed memory address, from address inputs AO through A10 116, in latch 118. The latched row address 120 is decoded in row decoder 122. The decoded row address is used to select a row of the memory array 112. An active-low column address strobe (CAS*) signal 124 is used to latch a second portion of a memory address from address inputs 116 into column address counter 126. The latched column address 128 is decoded in column address decoder 130. The decoded column address is used to select a column of the memory array 112.

In a burst read cycle, data within the memory array located at the row and column address selected by the row and column address decoders is read out of the memory array and sent along data path 132 to output latches 134. Data 110 driven from the burst EDO DRAM may be latched external to the device with a CAS* signal after a predetermined number of CAS* cycle delays (latency). Once the memory device begins to output data in a burst read cycle, the output drivers 134 will continue to drive the data lines without tri-stating the data outputs during CAS* high intervals dependent on the state of the output enable and write enable (OE* and WE*) control lines, thus allowing additional time for the system to latch the output data. Once a row and a column address are selected, additional transitions of the CAS* signal are used to advance the column address within the column address counter in a predetermined sequence. The time at which data will be valid at the outputs of the burst EDO DRAM is dependent only on the timing of the CAS* signal provided that OE* is maintained low, and WE* remains high. As with the memory of FIG. 1, the output data signal levels may be driven in accordance with standard CMOS, TTL, LVTTL, GTL, or HSTL output level specifications. Further, the address may be advanced linearly, or in an interleaved fashion for maximum compatibility with the overall system requirements as shown in FIG. 2.

In the burst access memory device, each new column address from the column address counter is decoded and is used to access additional data within the memory array without the requirement of additional column addresses being specified on the address inputs 116. This burst sequence of data will continue for each CAS* falling edge until a predetermined number of data accesses equal to the burst length has occurred. A CAS* falling edge received after the last burst address has been generated will latch another column address from the address inputs 116 and a new burst sequence will begin. Read data is latched and output with each falling edge of CAS* after the first CAS* latency.

Input data from the input latches 134 is passed along data path 132 to the memory array where it is stored at the location selected by the row and column address decoders. As in the burst read cycle previously described, a predetermined number of burst access writes will occur without the requirement of additional column addresses being provided on the address lines 116. After the predetermined number of burst writes has occurred, a subsequent CAS* will latch a new beginning column address, and another burst read or write access will begin.

The write enable signal is used in burst access cycles to select read or write burst accesses when the initial column address for a burst cycle is latched by CAS*. WE* low at the column address latch time selects a burst write access. WE* high at the column address latch time selects a burst read access. The level of the WE* signal must remain high for read and low for write burst accesses throughout the burst access. A low to high transition within a burst write access will terminate the burst access, preventing further writes from occurring. A high to low transition on WE* within a burst read access will likewise terminate the burst read access and will place the data output 110 in a high impedance state. Transitions of the WE* signal may be locked out during critical timing periods within an access cycle in order to reduce the possibility of triggering a false write cycle. After the critical timing period, the state of WE* will determine whether a burst access continues, is initiated, or is terminated. Termination of a burst access resets the burst length counter and places the DRAM in a state to receive another burst access command.

Control circuitry 138, in addition to performing standard DRAM control functions, controls thI I/0 circuitry 134 and the column address counter/latch 126. The control circuity determines when a current data burst should be terminated based upon the states of RAS* 114, CAS* 124 and WE* 136. In the standard BEDO operation described above, control circuitry 138 terminated a data burst when WE* transitioned during a burst, or when both CAS* and RAS* transitioned high. In a CBEDO operation, control circuitry 138 does not terminate a burst operation when CAS* and RAS* go high, but looks to WE* for an indication that a burst operation is to be terminated. Continuous mode circuitry 141 can be optionally provided to allow the memory device to operate in either the standard BEDO operation or a CBEDO operation.

A basic implementation of the device of FIG. 5 may include a fixed burst length of 4, a fixed CAS* latency of 2 and a fixed interleaved sequence of burst addresses. Further, just as fast page mode DRAMs and EDO DRAMs are available in numerous configurations including x1, x4, x8 and x16 data widths, and 1 Megabit, 4 Megabit, 16 Megabit and 64 Megabit densities; the burst access memory device of FIG. 5 may take the form of many different memory organizations.

Figure 6A:
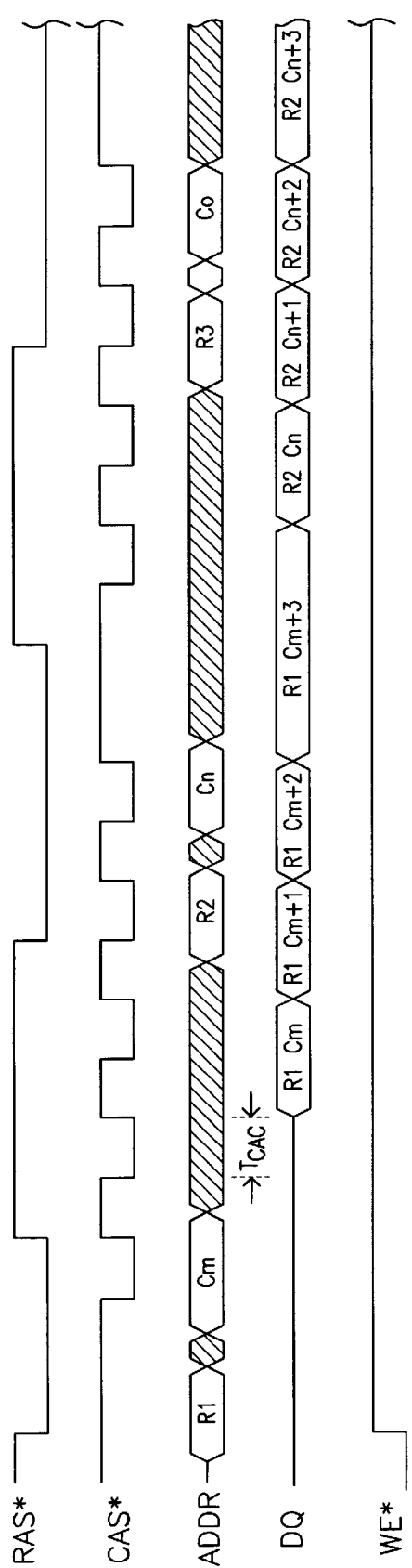
FIG. 6a is a timing diagram of the operation of the device of FIG. 5.
Figure 6B:
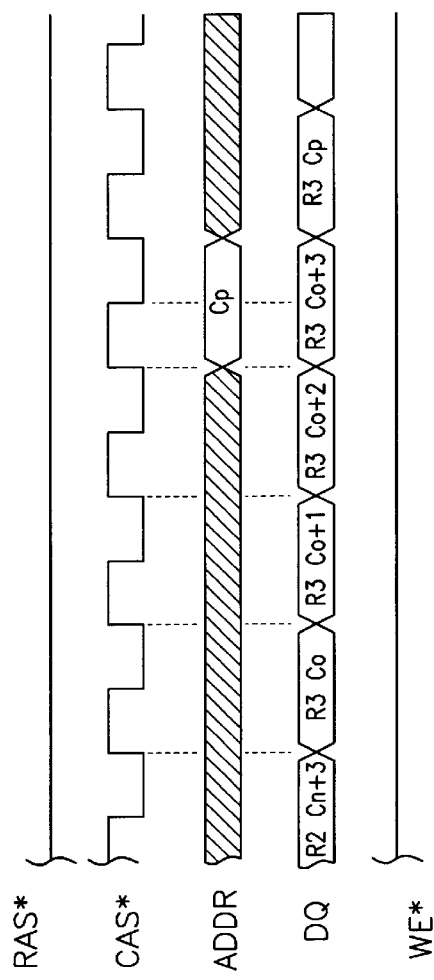

FIGS. 6a and 6b is a timing diagram for performing a continuous burst read of the device of FIG. 5. In FIGS. 6a and 6b, row address 1 is latched on the first falling edge of the RAS* signal. WE* is low when RAS* falls for an embodiment of the memory device where the state of the WE* pin is used to specify a burst access cycle at RAS* time. Next, with WE* high, CAS* is driven low to initiate a burst read access, and column address m is latched. The data out signals (DQ's) are not driven in the first CAS* cycle, but remain tri-state. On the second falling edge of the CAS* signal, data stored at column m is output on the DQ lines after a CAS* to data access time ($T_{CAC}$). On the rising edges of CAS*, the internal address generation circuitry advances the column address. Data stored at column addresses m+1, m+2, and m+3 are output on the falling edges of CAS*. After column address m is latched, the RAS* signal goes high to begin the sequence of accessing a new row. While data is being provided on the DQ lines from row 1, RAS* goes low to latch a new row address (2) from the address inputs. It will be appreciated that the RAS* signal transitioned high and low without interrupting the data output on the DQ lines. A new column address will be loaded on the last CAS* cycle of a burst, For example in FIGS. 6a and 6b, a new column address (n) is latched on the first CAS* active transition following the beginning of the RAS* cycle. The burst read operation continues uninterrupted for rows 2 and 3, and columns n, o, and p. To terminate a continuous burst read operation, the WE* signal merely has to transition high prior to a falling edge of the CAS* signal.

It will be appreciated that the read and write operations performed on a single memory row of the memory of FIG. 5 are identical to the operation of the memory of FIG. 1 as shown in FIG. 3. That is, after completing a burst read, the WE* signal transitions low and the next falling edge of CAS* latches a new column address for a burst write operation. Likewise, the timing diagram of FIG. 4 depicting burst write access cycles followed by burst read cycles can be replicated with the memory of the present invention. As such, BEDO memory devices can be replaced with CBEDO memory devices without effecting the operation of the memory support system. It will further be appreciated by those skilled in the art that the memory device of FIG. 5 can operate with burst lengths of 2, 4, 8, or full row cycles.

Figure 7A:
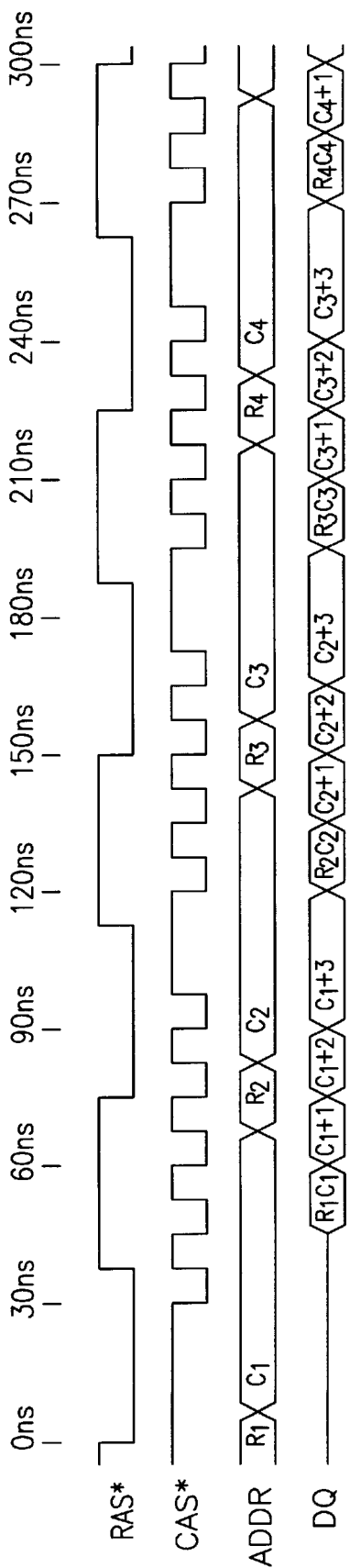
FIG. 7a is a timing diagram of a series of continuous burst read operations.
Figure 7B:
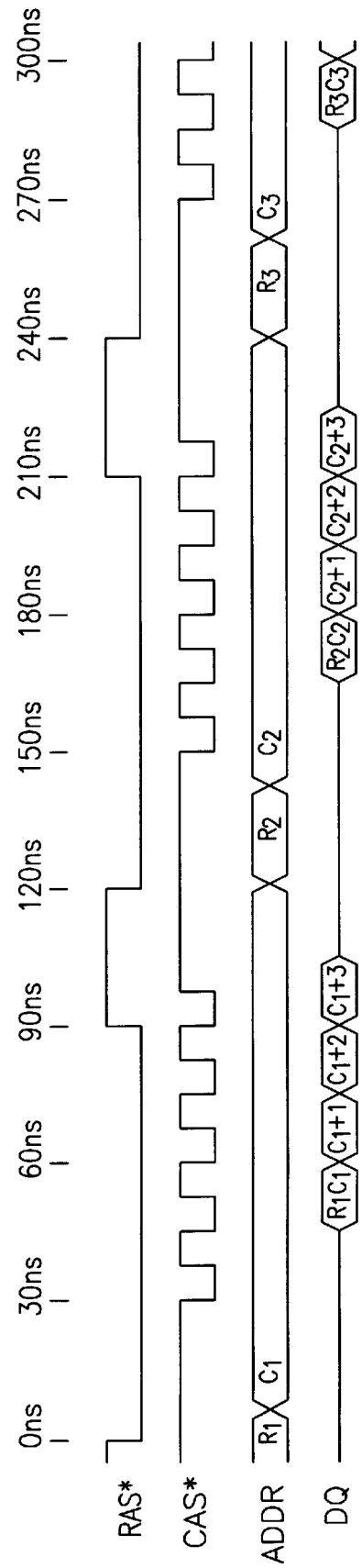
FIG. 7b is a timing diagram of a series of burst read operations.

FIGS. 7a and 7b are provided to more clearly illustrate the advantages of the CBEDO memory over BEDO memory devices. The timing diagram of FIG. 7a shows one possible series of burst read operations on four different memory rows (R1, R2, R3 and R4) in a CBEDO memory device. FIG. 7b shows burst read operations in a BEDO memory device. On the first CAS* cycle of the first RAS* cycle, an initial column address is latched from the external address inputs. Data out is burst onto the DQ lines on the next four CAS* cycles. Once the initial column has been latched and the $T_{RAS}$ minimum specification has been satisfied, RAS* can toggle high and then low again without disrupting the burst. To avoid a premature termination of a burst, RAS* cannot transition high until after the last column associated with each row has been latched. For the example shown in FIG. 7, the second RAS* cycle cannot transition high until after the CAS* cycle which latches column C2. This ensures the column which is to be bursted upon is latched prior to RAS* going high and terminating the burst.

As described above, a memory cell cannot be accessed until time $T_{RAC}$ following the start of a RAS cycle. It can be seen that the CBEDO memory device reduces the time needed to burst read data from several memory rows. For example, using a 66 MHz clock, a CBEDO memory operating with a 4 bit burst length can output 26 different bits of data from 7 different rows in 600 ns, while a BEDO memory device operating with a 4 bit burst length is limited to 16 bits from 4 different rows during the same time period. It is also important to point out that for multiple bursts upon the same row (RAS* cycles low and stays low for several different columns) the CBEDO and BEDO perform identically.

The CBEDO memory device of the present invention allows both RAS* and CAS* to transition high during a burst read operation without terminating the burst output stream on the DQ lines. Thus, a data burst read is continued when RAS* both transitions high and transitions low and the data drivers are not placed in a high impedance output state. While operating in a continuous burst mode, the memory device continues a burst read data while a new memory array row is being addressed. It will be understood by those skilled in the art that a word line coupled to access transistors in a memory do not need to remain active during a full burst operation. That is, each memory row word line is connected to an access transistor for each memory cell in that array row. All memory cells are, therefore, accessed at once when the word line is activated. By latching the data stored in the memory cell with latches 134, a first word line can be deactivated and another word line activated. As known to those skilled in the art, digit lines and sense amplifiers are used to read data stored in the memory cells. These bit lines must be equilibrated prior to reading a memory cell. The equilibration and memory cell access processes require a minimum specified time. These processes can be accomplished in the memory device of FIG. 5 during a continuing burst operation, as explained above, thereby increasing the data rate of the memory device.

Conclusion

A memory device has been described which can operate at fast data rates. The memory device is a random access memory having rows and columns of memory elements. After accessing an array row, an internal memory addressing circuit allows access to numerous columns of data while requiring only one external column address. The memory device can receive and access a new memory row without interrupting the burst of data from the previously accessed row. This continuous burst operation allows for faster data rates by eliminating the need to terminate a output data while addressing a new memory row.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, an external clock signal could be used to synchronize the burst access operation in place of the CAS* signal. Therefore, it is manifestly intended that this invention be limited only by the claims and the equivalents thereof.

What is claimed is:

1. A synchronous memory device comprising:

an input for receiving a clock signal;

a plurality of addressable memory elements;

a plurality of external address inputs;

address counter circuitry for receiving a first address on the plurality of external address inputs, and for generating a sequence of addresses in response to the first address and the clock signal; and output buffer circuitry adapted to drive a sequence of data from the memory device, the output buffer circuitry further adapted to continue to drive the sequence of data from the memory device while a new address is received by the address counter circuity.

2. The synchronous memory device of claim 1 wherein the address counter circuitry comprises:

an address latch circuit coupled to the plurality of external address inputs; and a counter coupled to the address latch circuit for generating the sequence of addresses.

3. The synchronous memory device of claim 1 further comprising:

access circuitry for reading data stored in the plurality of addressable memory elements.

4. The synchronous memory device of claim 1 further comprising:

a write enable signal input for receiving an enable signal; and termination circuitry coupled to the output buffer circuitry for terminating an output of the sequence of data.

5. A synchronous memory device comprising:

an input for receiving a clock signal;

a plurality of addressable memory elements arranged in rows and columns;

a plurality of external address inputs;

address circuitry for receiving row addresses and column addresses from the plurality of external address inputs;

counter circuitry for generating a sequence of column addresses in response to a first received clock signal;

row access circuitry for accessing a row of memory elements in response to a received first row address;

output buffer circuitry adapted to output a sequence of data from the memory device, the sequence of data being stored in the plurality of addressable memory elements having addresses corresponding to the sequence of addresses and the first row address; and control circuitry for controlling the output buffer circuitry and the access circuitry, wherein a second row of memory elements can be accessed without interrupting an active output sequence of data from the first row address.

6. The memory device of claim 5 further comprising:

a write enable signal input for receiving an enable signal; and termination circuitry coupled to the output buffer circuitry for terminating an output of the sequence of data.

7. A memory device comprising:

a plurality of addressable memory elements;

a plurality of external address inputs;

first means for receiving a first address on the plurality of external address inputs, and for generating a sequence of addresses in response to the first address; and second means for driving a sequence of data from the memory device while a new address is received by the first means.

8. The memory device of claim 7 wherein the memory device is a dynamic random access memory.

9. The memory device of claim 7 wherein the memory device is a synchronous dynamic random access memory.

10. A method of reading data from a synchronous memory device having a plurality of addressable memory elements arranged in rows and columns, the method comprising the steps of:

receiving a first row address;

receiving a first column address;

accessing a row of memory elements having the first row address;

generating a sequence of column addresses starting at the first column address;

outputting data stored at the sequence of column addresses;

receiving a second row address while outputting the data stored at the sequence of column addresses; and accessing a row of memory elements having the second row address while outputting the data stored at the sequence of column addresses.

11. The method of claim 10 further including the step of:

initializing a burst read operation on an edge of the clock signal.

12. The method of claim 10 further including the steps of:

receiving a signal on a write enable input; and terminating the step of outputting data in response to the signal on the write enable input.

13. The method of claim 10 further including the steps of:

initializing a burst write operation on an edge of the clock signal;

receiving a second column address;

generating a second sequence of column addresses starting at the second column address; and storing data in a plurality of addressable memory elements having address corresponding to the second sequence of column addresses.

14. The method of claim 10 further including the steps of:

receiving a second column address;

accessing a row of memory elements having the second row address;

generating a second sequence of column addresses starting at the second column address; and outputting data stored at the second sequence of column addresses.

15. The method of claim 10 wherein the sequence of data is output in response to the clock signal.

* * * * *

UNITED STATES PATENT AND TRADEMARK OFFICE
CERTIFICATE OF CORRECTION

PATENT NO.: 5,946,265

DATED: August 31, 1999

INVENTOR(S): Timothy B. Cowles

It is certified that error appears in the above-identified patent and that said Letters Patent is hereby corrected as shown below:

Item [54], and col. 1, Title page, change title as follows: Delete "Continuous Burst EDO Memory Device" and Insert --Continuous Output Memory Device--, therefore.

Signed and Sealed this

Twenty-seventh Day of June, 2000

Attest:

Q. TODD DICKINSON

*Attesting Officer*  *Director of Patents and Trademarks*